(12) United States Patent
Furukawa et al.

(10) Patent No.: US 6,576,500 B2
(45) Date of Patent: Jun. 10, 2003

(54) METHOD OF PLASMA-PROCESSING A BOARD, CHIP ATTACHMENT TO THE BOARD AND RESIN ENCAPSULATION OF THE CHIP

(75) Inventors: Ryota Furukawa, Fukuoka (JP); Ryuji Nagadome, Kurume (JP)

(73) Assignee: Matsushita Electric Industrial Co., Ltd. (JP)

( * ) Notice: Subject to any disclaimer, the term of this patent is extended or adjusted under 35 U.S.C. 154(b) by 0 days.

(21) Appl. No.: 09/948,098

(22) Filed: Sep. 7, 2001

(65) Prior Publication Data
US 2002/0034840 A1 Mar. 21, 2002

(30) Foreign Application Priority Data

Sep. 8, 2000 (JP) ........................................ 2000-272819
Sep. 8, 2000 (JP) ........................................ 2000-272820

(51) Int. Cl.$^7$ .............................................. H01L 21/44
(52) U.S. Cl. ...................... 438/127; 438/115; 438/906
(58) Field of Search ................................. 438/115, 906, 438/127, 110, 111, 112

(56) References Cited

U.S. PATENT DOCUMENTS 6,069,024 A * 5/2000 Murakami .................. 438/108
6,117,708 A * 9/2000 Wensel ....................... 438/118
6,261,869 B1 * 7/2001 Radford et al. ............. 438/123

FOREIGN PATENT DOCUMENTS

JP 11111694 * 4/1999

* cited by examiner

Primary Examiner—Kamand Cuneo
Assistant Examiner—Scott B. Geyer
(74) Attorney, Agent, or Firm—Parkhurst & Wendel, L.L.P.

(57) ABSTRACT

A plasma-processing apparatus providing a resin mold domed enough to allow no bonding wires to be exposed is presented. The plasma-processing apparatus cleans a board including a chip mounted thereon and a disposing area for a pad formed around the chip. The apparatus includes a chamber for accommodating the board; an electrode mounted to the chamber for generating plasma in the chamber with a voltage applied thereto, a table for supporting the board in the chamber, and a masking member which is provided above the board. The masking member has an opening for exposing the chip and the disposing area to the plasma.

3 Claims, 7 Drawing Sheets

METHOD OF PLASMA-PROCESSING A BOARD, CHIP ATTACHMENT TO THE BOARD AND RESIN ENCAPSULATION OF THE CHIP

FIELD OF THE INVENTION

The present invention relates to plasma-processing apparatus and method for plasma-cleaning pads on a chip and pads on a board to which chips are mounted, and a plasma-processed board, and further relates to a chip mounting method employing the plasma-processing method and a chip mounted assembly.

BACKGROUND OF THE INVENTION

A plasma-cleaning process, which is known, removes a dirt on a pad at the sides of a position for mounting a chip on a printed circuit board or on a pad on the upper surface of the chip prior to a wire bonding to the pad. In the plasma-cleaning process, the board including the chip mounted thereon is placed in a chamber of a plasma-processing apparatus, in which plasma is generated, and ions and neutral particles called radicals collide with the surface of the chip to remove the dirt on the board. After the plasma-cleaning process, the pad on the chip and the board are connected with wires by a wire bonding apparatus. Finally, the chip and the wires are covered with a resin by mold sealing.

FIG. 7 is a side view of a board including a conventional resin mold 6'. A chip 2 is mounted on a chip-mounting position 1' of a board 1. A Pad 3 at the side of the position 1' is connected to a pad 4 on the upper surface of the chip 2 with a wire. The resin mold 6' is provided for protecting the chip 2 and the wire 5 by mold sealing.

As denoted by the solid line in FIG. 7, the resin mold 6' flows wide and flattens around the chip 2 but is not domed. This causes the top of the wire 5 to be exposed out of the resin mold 6'. A desired shape of the resin mold 6 is denoted by the dotted line keeping a dome shape to encapsulate the chip and wire 5.

The reason why the resin mold 6' is not domed but flattened is explained below. In a conventional plasma-processing apparatus, the board 1 has an entire surface exposed for plasma for the plasma-cleaning. As being plasma-cleaned, the entire surface has an increased wetting property. Accordingly, the resin used with resin mold 6' has increased adhesive properties. And therefore, the molded form of the resin may thus flow extensively around the chip and flatten over the upper surface of the board 1 before being cured down. As a result, the resin mold 6' has a flat shape as denoted by the solid line in FIG. 7.

SUMMARY OF THE INVENTION

A plasma-processing apparatus for plasma-cleaning a board having a chip and a pad-disposed area around the chip includes a chamber for accommodating the board, an electrode disposed at the chamber for generating plasma in the chamber by a high frequency voltage applied to the electrode; a table for supporting the board in the chamber, and a masking member provided above the board and having an opening for exposing the chip and the pad-disposed area to the plasma.

A plasma-processing method using the plasma-processing apparatus includes a process of applying a voltage to the electrode to generate plasma in the chamber; and a process of exposing the chip and the pad area to the plasma through the opening of the masking member for performing the plasma-process.

DETAILED DESCRIPTION OF THE PREFERRED EMBODIMENTS

Embodiment 1

Figure 1:
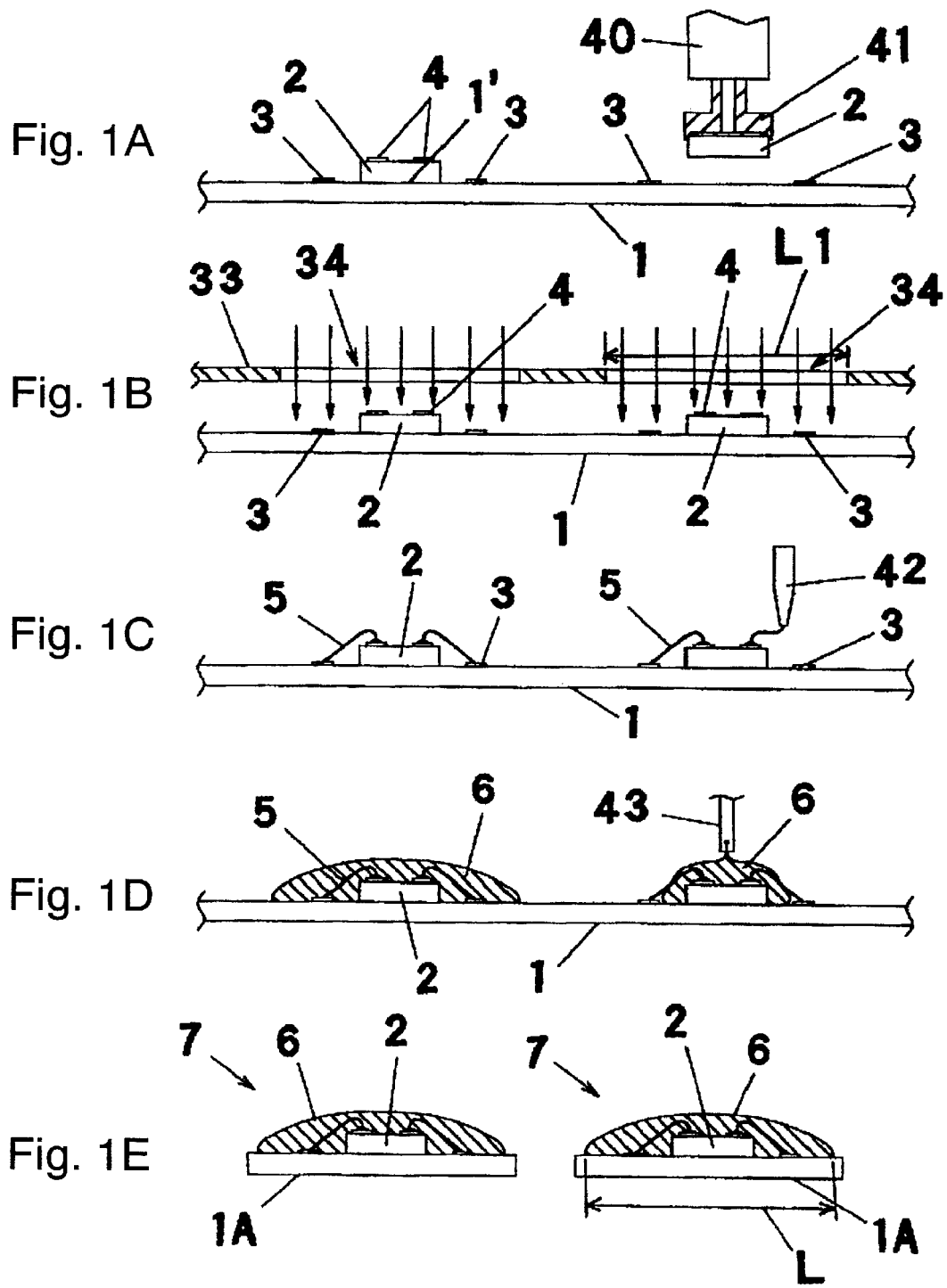
FIGS. 1A to 1E illustrate a procedure of mounting a chip according to Embodiment 1 of the present invention.
Figure 2:
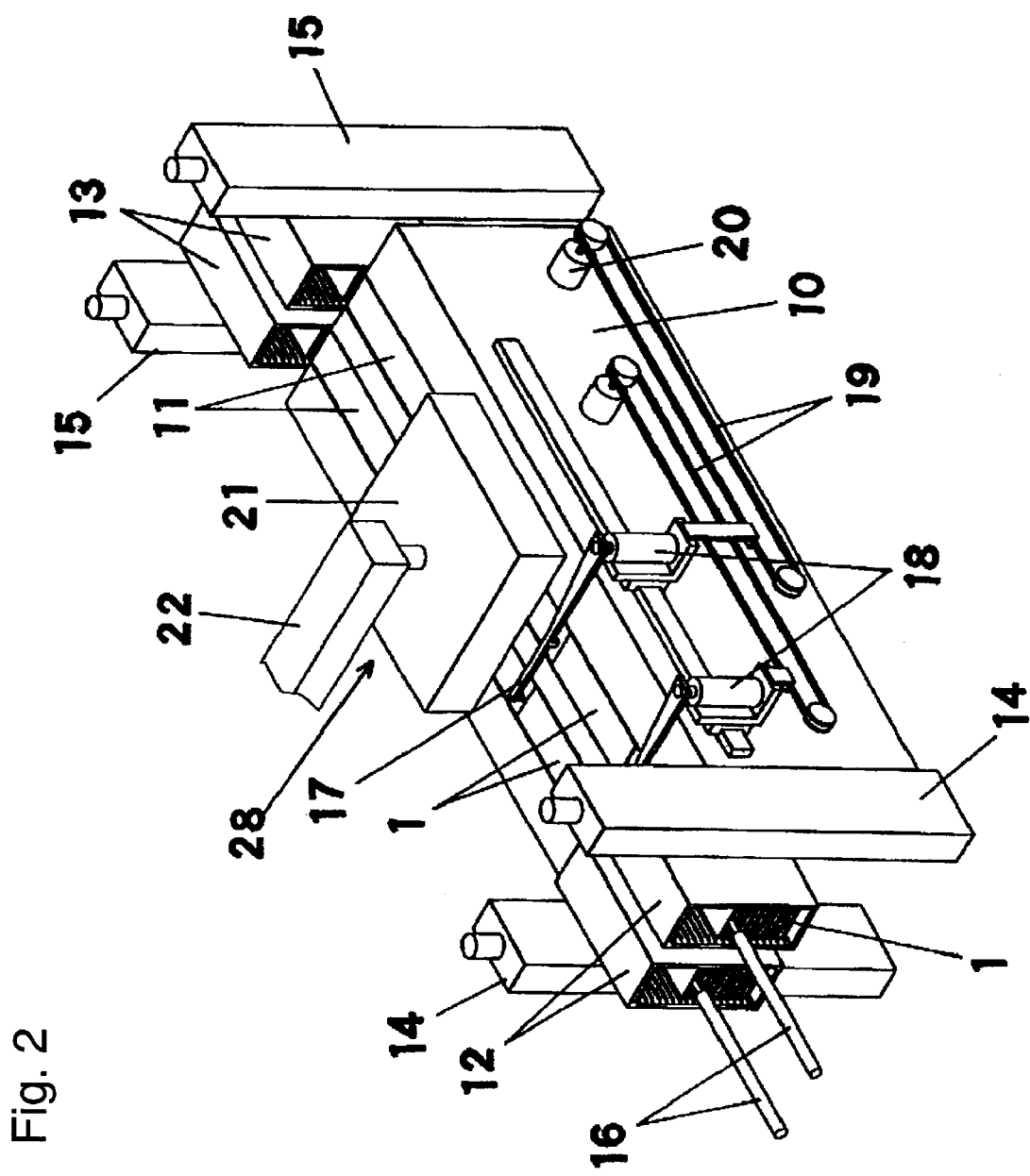
FIG. 2 is a perspective view of a plasma-processing apparatus according to Embodiment 1.
Figure 3:
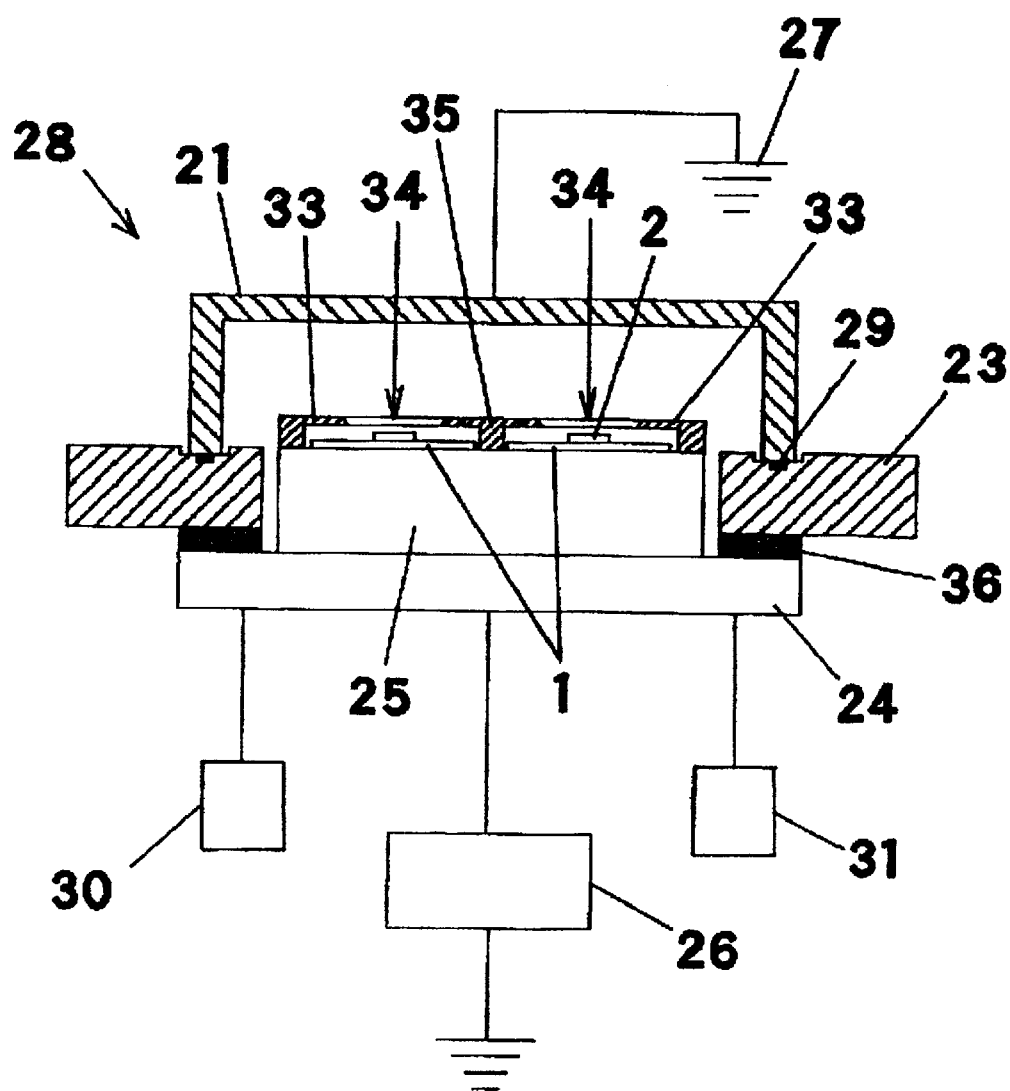
FIG. 3 is a cross sectional view of the plasma-processing apparatus according to Embodiment 1.
Figure 4:
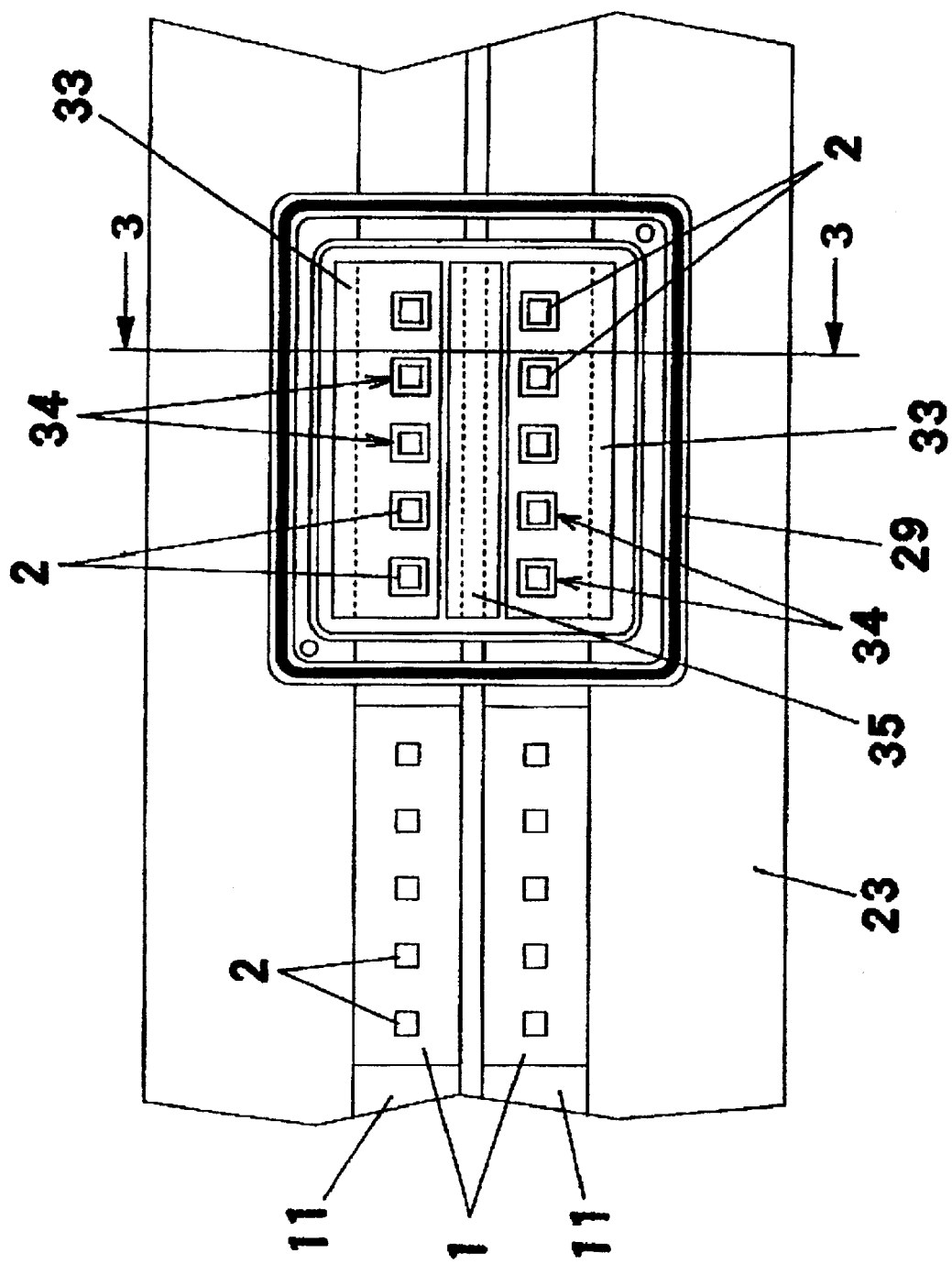
FIG. 4 is a plan view of the plasma-processing apparatus according to Embodiment 1.
Figure 5:
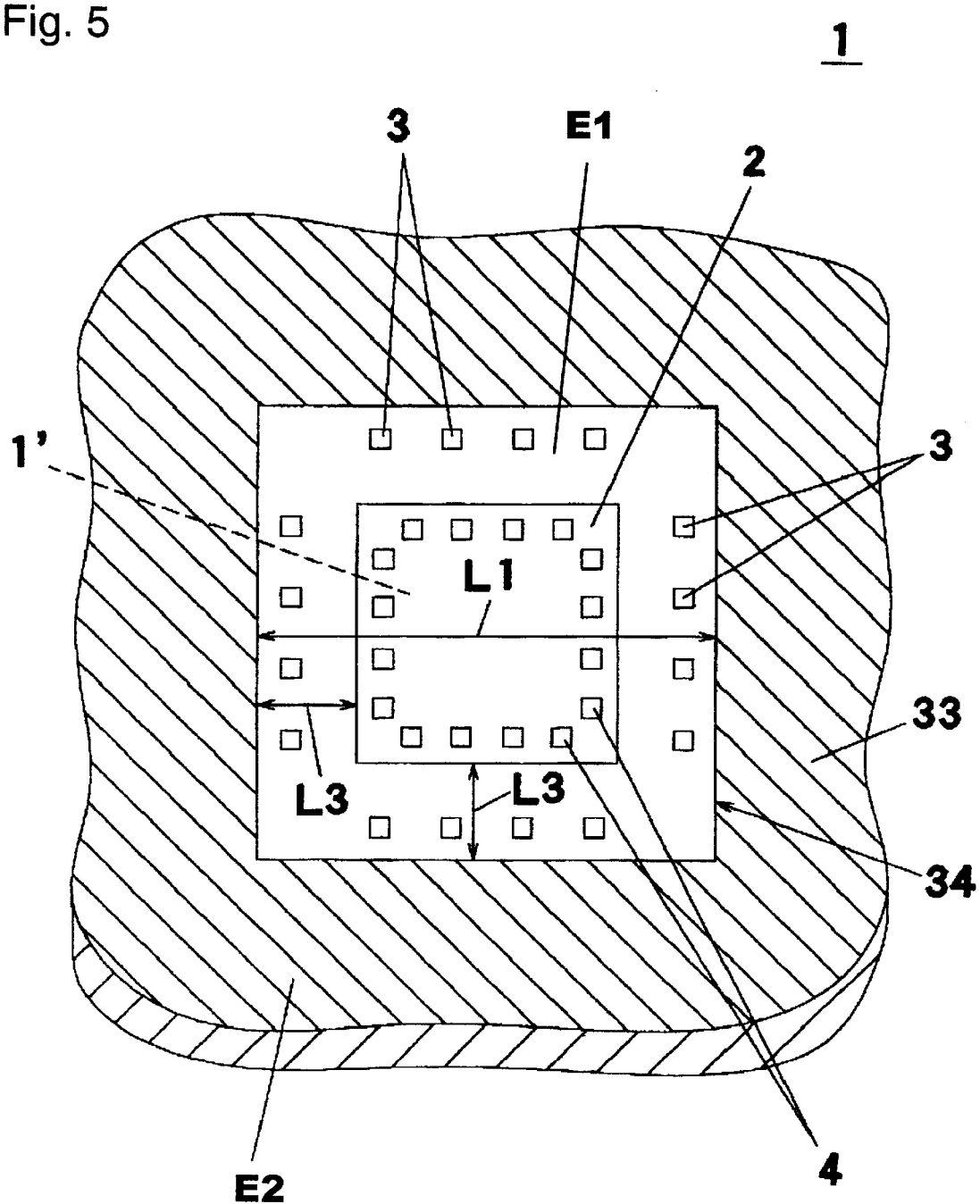
FIG. 5 is a partial plan view of a board according to Embodiment 1.
Figure 7:
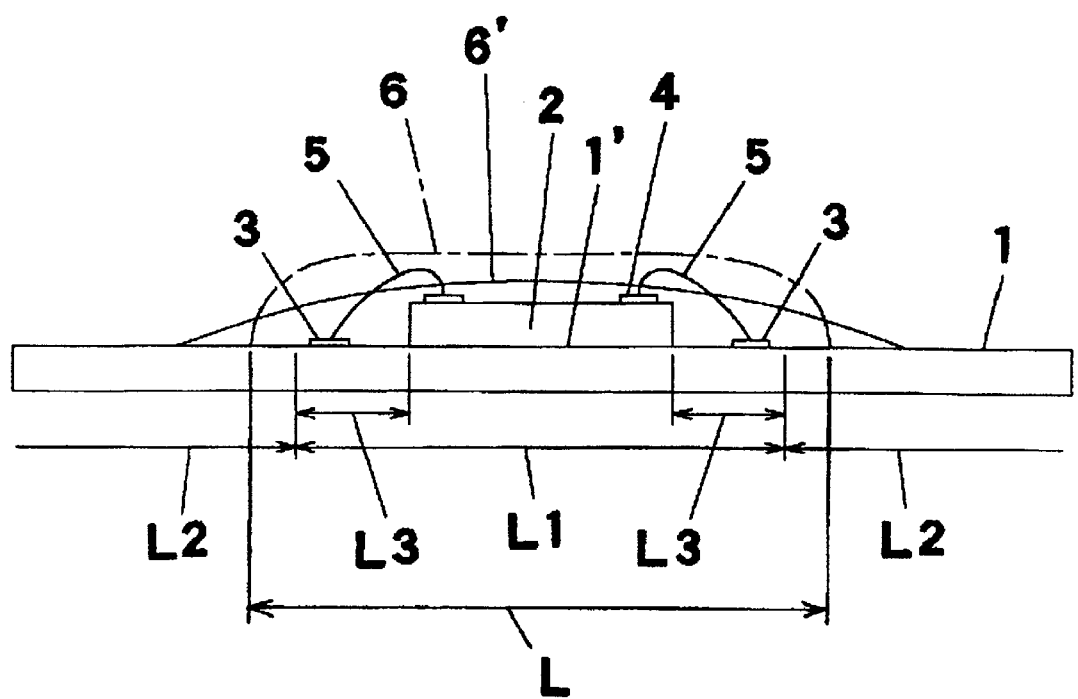
FIG. 7 is a side view of a board having a resin mold provided thereon according to Embodiment 1 and a prior art.

FIGS. 1A to 1E illustrate a procedure of mounting a chip according to Embodiment 1 of the present invention. FIG. 2 is a perspective view of a plasma-processing apparatus according to Embodiment 1. FIG. 3 is a cross sectional view of the plasma-processing apparatus. FIG. 4 is a plan view of the plasma-processing apparatus. FIG. 5 is a partial plan view of a board according to Embodiment 1. FIG. 7 is a side view of the board having a resin mold provided thereon according to Embodiment 1.

A procedure of mounting a chip will be described in steps. FIG. 1A illustrates a die bonding process. A chip 2 is mounted on a chip mounting position 1' of the upper surface of a board 1. Pads 3 of a circuit pattern are formed around the position 1', and a pad 4 is formed on the upper surface of the chip 2. The chip 2 is sucked with a nozzle 41 of a head 40 and placed on the board 1. In this embodiment, the board 1 is a multi-board sheet, which is separated into small board units at a later step.

FIG. 1B illustrates a plasma-cleaning process. A masking member 33 is placed above the board 1. The board 1 and the chips 2 have a portion exposed through openings 34 provided in the masking member 33 and cleaned with plasma applied on the portion.

FIG. 1C illustrates a wire bonding process. The pads 3 and 4 cleaned by the plasma-process are connected to each other with wires 5 released from a capillary tool 42 of a wire bonding apparatus.

FIG. 1D illustrates a resin-applying process. Drops of sealing resin 6, e.g. epoxy resin, are applied from a nozzle 43 of a resin applying apparatus for encapsulating the chips 2 and the wires 5. The sealing resin 6 is then cured by a curing process. The wires 5 are prevented from being exposed out of the sealing resins 6 flowing extensively and flattening due to the plasma-process for the surface of the board 1.

FIG. 1E illustrates a separating process. The board 1 is separated by a cutting device such as a cutter (not shown) into small board units 1A, which become chip mounted assemblies 7.

An overall arrangement of the plasma-processing apparatus will be described with referring to FIG. 2. A guide rail 11 for conveying the board 1 are provided on a table 10. A loader 12 and an unloader 13 are provided at both ends of the guide rail 11. The loader 12 and the unloader 13 have heights capable of being adjusted with elevators 14 and 15, respectively. The loader 12 holds a stack of the boards 1 in shelves. The boards 1 can be transferred to the guide rail 11 one at a time by a pusher 16. The board 1 carries plural chips 2 mounted thereon at the process shown in FIG. 1A.

A top cover 21 of a chamber 28 is bridged over a central region of the guide rail 11. The top cover 21 is supported by an arm 22 and can be lifted up and down for opening and closing with the arm 22. A transfer finger 17 forwards the board 1 from the loader 12 to the unloader 13 along the guide rail 11. The transfer finger 17 can be lifted up and down with a cylinder 18. The transfer finger 17 and cylinder 18 move in pitches by an endless belt 19, which is driven by a motor 20.

The plasma-processing apparatus will be described in more detail with referring to FIGS. 3 and 4. FIG. 3 is a cross sectional view at a line 3—3 in FIG. 4. As shown in FIG. 3, the top cover 21 capable of moving upward and downward is disposed over a support 23. A lower electrode 24 is provided beneath the top cover 21. A table 25 is disposed over the lower electrode 24. The lower electrode 24 is electrically connected to a high-frequency power supply 26, and the top cover 21 is grounded to a grounding port 27. The top cover 21 and lower electrode 24 form the chamber 28 for generating plasma. A sealing member 29 is also provided on the support 23. The interior of the chamber 28 is evacuated by a vacuum sucking apparatus 30 such as a vacuum pump. The chamber 28 is filled with a gas for generating the plasma provided by a gas feeder 31. The lower electrode 24 and bed 25, as being connected to the power supply 26, can function as a single electrode.

In FIG. 3, a masking member 33 is provided over the bed 25. The masking member 33 may be made of electrically insulating, hard material such as ceramic. The masking member 33 has an opening 34 provided therein for exposing the chip 2 and its peripheral region to the plasma.

As shown in FIG. 5, the pad 4 is provided on the upper surface of the chip 2, and the pad 3 is provided in a circuitry pattern on the upper surface of the board 1. That is, the chip 2 is mounted on a chip-mounting position 1' of the board 1. The pad 2 is formed to surround the chip 2 beside the position 1' of the board 1. The opening 34 of the masking member 33 had a width L1 sized to expose the chip 2 and a disposing area E1 of the pad 3. The disposing area E1 had a width L3 between the inner edge at the opening 34 of the masking member 33 and the outer edge of the chip 2. In an area E2, which is covered with the making member over the board 1, the resin is prevented from flowing extensively. In FIG. 3, two boards 1 placed on the table 25 are separated by a partition 35 at the center of the table. An insulating member 36 is provided between the lower electrode 24 and the support 23.

An operation of the plasma-processing apparatus will be explained. In FIG. 2, the board 1 released from the loader 12 by the pusher 16 is conveyed by the transfer finger 17 to the table 25 shown in FIG. 3. At the moment, the top cover 21 remains at an upper position to clear the upper surface of the table 25. Then, the top cover 21 is fallen down to the support 23 to shut off the chamber 28. At the moment, the chip 2 on the board 1 is located just beneath the opening 34 of the masking member 33.

Then, the chamber 28 is evacuated by the vacuum sucking apparatus 30, and the gas feeder 31 fills the chamber 28 with plasma gas such as argon gas. Then, the lower electrode 24 is fed with a high-frequency voltage from the power supply 26. The plasma generated in the chamber 28 passes through the opening 34 and strikes against the upper surfaces of the chip 2 and the board 1 to clean the upper surfaces with an etching effect or the like.

In FIG. 3, the pad 3 of the board 1 and the pad 4 of the chip 2 are exposed through the opening 34. Dirt on the pads 3 and 4 can thus be removed by the etching effect of the plasma. Simultaneously, the upper surface of the board 1 exposed through the opening 34 is etched and activated by the plasma to have an increased wetting property. The increased wetting property increases the adhesive properties of the resin mold 6.

After the plasma-processing is completed, the top cover 21 is lifted up, and the (plasma-processed) board 1 on the bed 25 is conveyed by the transfer finger 17 to the unloader 13 unloading the board. By repeating the foregoing processes, the boards 1 in the loader 12 are plasma-processed and received by the unloader 13.

The unloader 13 is then transferred to the wire bonding apparatus connecting the pads 3 of the board 1 to the corresponding pads 4 of the chip 2 with the wire 5 as shown in FIG. 1C. The pads 3 and 4, as being cleaned by the plasma etching, can be bonded with each other easily with the wires 5.

After the wire bonding process, the boards 1 are transferred to a resin applying apparatus. The board 1 has the surface coated with the rein 6 to encapsulate the chip 2 and wire 5 to form a resin mold as shown in FIG. 1D.

As a result, the resin mold 6 in FIG. 7 provided on the plasma-processed board 1 has a domed shape and is not flattened. In FIG. 5, the area E1 of the board 1 including the pad 3 is exposed to the plasma through the opening 34 having the width L1 of the masking member 33, and therefore, has an improved wetting property. This allows the resin mold 6 to be securely adhered to the upper surface of the board 1 in the exposed area E1. The resin-flow-protecting area E2 (denoted by the hatching in FIG. 5) around the exposed area E1 including the pad 3 is covered with the masking member 33 and protected from the plasma, and has a low wetting property. Under the low wetting property, the resin mold on the board 1 does not flow extensively and stays tenaciously unlike that in the prior art process. The resin mold 6 is domed but not flattened as shown in FIG. 7, hence having a raised shape for encapsulating the chip 2 and wire 5 completely. The resin mold 6 may have a width L1 equal to or slightly greater than the width L1 of the opening 34. Then, the board 1 is separated into small board units 1A, which become chip-mounted assemblies 7, as shown in FIG. 1E.

Embodiment 2

FIGS. 6A to 6D illustrate processes of a chip mounting method according to Embodiment 2 of the present invention. In this embodiment, a chip 53 having a bump 54 is mounted on the board. At a chip-mounting position 1', pads 3 where the bump 54 is jointed are formed. That is, the chip-mounting position is a disposing area E3 of the pads 3.

Figure 6:
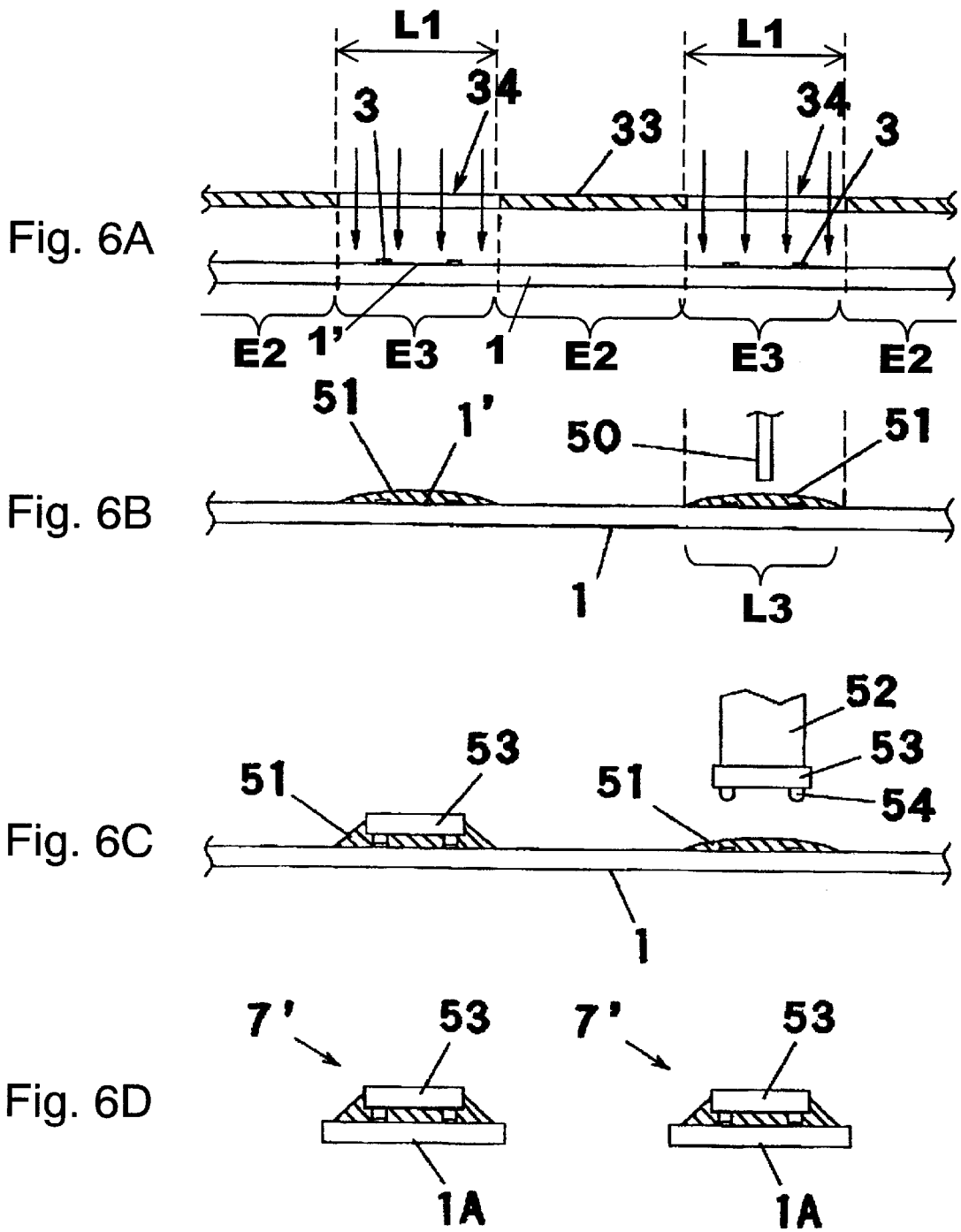
FIGS. 6A to 6D illustrate a chip mounting method according to Embodiment 2 of the invention.

FIG. 6A illustrates a plasma-cleaning process substantially identical to that explained in Embodiment 1. A chip is not mounted on the board 1. The upper surface of the board and the pads 3 in the disposing area E3 exposed through an opening 34 of a masking member 33 are plasma-cleaned. The disposing area E3 to which plasma is applied through the opening 34 is processed by a plasma-process with in a width L1.

Then, an under-fill resin 51, which is the same as bonding resin 51, is released from a nozzle 50 of a resin coating apparatus and applied to the disposing area E3 as shown in FIG. 6B. A resin-flow-protecting area E2 prevents a resin 51 from flowing extensively on the board 1, and therefore, the resin stays within the disposing area E3 where the plasma is collided. The reason is described previously.

Then, as shown in FIG. 6C, a tool 52 of a bonding apparatus holds a chip 53 having a bump such as a flip-chip, and positions the bump 54 directly on the pad 3 on the board 1. In this embodiment, the tool 52, which also functions as a heater, heats up the chip 53 to bond the bump 54 to the pad 3. As being lifted down and placed directly on the resin mold 51, the chip 53 has a lower surface closely adhered to the resin mold 51. The resin mold 51 is then cured at a curing process, and then, the board 1 is separated into small board units 1A, which become chip mounted assemblies 7' as shown in FIG. 6D.

According to the method of this embodiment, a chip mounted assembly is provided, which has the resin mold 51 prevented from flowing extensively, and an increased bonding effect between the bumps 54 and the pad 3.

What is claimed is:

1. A method of plasma cleaning, comprising:

locating a masking member above a board having a chip mounted thereon, the board including at least one pad area adjacent the chip and a resin-flow-protecting area, the masking member for covering the resin-flow-protecting area, the masking member having an opening for exposing the chip and the pad area;

applying plasma to the chip and the at least one pad area through the opening of the masking member; and applying a resin to the chip and at least one pad area extending to a border between (i) the chip and at least one pad area and (ii) the resin-flow-protecting area.

2. A method of mounting a chip, comprising:

mounting a chip at a chip-mounting position of a board having at least one pad area adjacent the chip-mounting position and a resin-flow-protecting area around the at least one pad area, the chip having at least one pad on an upper surface thereof;

locating a masking member above the board, the masking member having an opening therein for exposing the chip-mounting position and the at least one pad area, the masking member covering a resin-flow-protecting area of the board;

plasma-processing an area of the board exposed through the opening;

connecting the at least one pad located on the upper surface of the chip to a pad located on said at least one pad area with a wire; and applying a resin to the chip-mounting position and the at least one pad area extending to a border between (i) the chip-mounting position and the at least one pad area and (ii) resin-flow-protecting area, for encapsulating the chip and wire.

3. A method of mounting a chip comprising:

locating a masking member above a board having a locating area for a chip and a resin-flow-protecting area, the masking member having an opening for exposing the locating area, the masking member covering the resin-flow-protecting area;

plasma-processing an area of the board exposed through the opening;

applying bonding resin to the locating area extending to a border between the locating area and the resin-flow-protecting area;

mounting the chip on the bonding resin; and curing the bonding resin.

* * * * *